(12) United States Patent
Tsuma

(10) Patent No.: US 12,154,963 B2
(45) Date of Patent: Nov. 26, 2024

(54) ALUMINUM ALLOY FILM AND SEMICONDUCTOR DEVICE USING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Hiroki Tsuma, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 238 days.

(21) Appl. No.: 17/830,690

(22) Filed: Jun. 2, 2022

(65) Prior Publication Data

US 2022/0399455 A1    Dec. 15, 2022

(30) Foreign Application Priority Data

Jun. 11, 2021  (JP) ................................ 2021-097965

(51) Int. Cl.
*H01L 29/49* (2006.01)
*H01L 29/423* (2006.01)

(52) U.S. Cl.
CPC ...... *H01L 29/4933* (2013.01); *H01L 29/4236* (2013.01)

(58) Field of Classification Search
CPC ......... H01L 29/16; H01L 29/45; H01L 29/49; H01L 29/78; H01L 29/423; H01L 29/4236; H01L 29/4933; H01L 29/7813; H01L 29/7827; H01L 29/1608; H01L 29/495; H01L 21/04; H01L 21/049; H01L 21/0485
USPC .................................................. 257/771, 765
See application file for complete search history.

(56) References Cited

U.S. PATENT DOCUMENTS

| | | | |
|---|---|---|---|
| 2015/0321294 A1* | 11/2015 | Anderson | ............... B23K 35/40 420/531 |
| 2016/0163806 A1 | 6/2016 | Nishimura | |
| 2021/0082596 A1 | 3/2021 | Araki et al. | |

FOREIGN PATENT DOCUMENTS

| | | |
|---|---|---|
| JP | H03-131031 A | 6/1991 |
| JP | H04-186728 A | 7/1992 |
| JP | H06-267953 A | 9/1994 |
| JP | 2016-143804 A | 8/2016 |
| JP | 2019-102896 A | 6/2019 |

* cited by examiner

*Primary Examiner* — Chuong A Luu
(74) *Attorney, Agent, or Firm* — Posz Law Group, PLC

(57) ABSTRACT

An aluminum alloy film includes an Al—Si—Mg alloy film containing at least 0.9% by weight to 1.1% by weight of Si and 0.1% by weight to 2.3% by weight of Mg, and the Al—Si—Mg alloy film contains Mg silicide crystals in Al crystals. A semiconductor device includes multiple gate trench structures, an interlayer insulating film covering the trench gate structures, an electrode film covering the interlayer insulating film, an insulating layer and a conductive layer covering the electrode film. The electrode film includes the Al—Si—Mg alloy film.

6 Claims, 5 Drawing Sheets

ALUMINUM ALLOY FILM AND SEMICONDUCTOR DEVICE USING THE SAME

CROSS REFERENCE TO RELATED APPLICATION

The present application claims the benefit of priority from Japanese Patent Application No. 2021-097965 filed on Jun. 11, 2021. The entire disclosure of the above application is incorporated herein by reference.

TECHNICAL FIELD

The present disclosure relates to an aluminum alloy film and a semiconductor device using the aluminum alloy film.

BACKGROUND

Conventionally, there have been known a power semiconductor device that uses a semiconductor substrate containing Si (silicon) or SiC (silicon carbide) as a main component and uses an aluminum alloy film as an electrode film.

SUMMARY

The present disclosure provides an aluminum alloy film and a semiconductor device. The aluminum alloy film includes an Al—Si—Mg alloy film containing at least 0.9% by weight to 1.1% by weight of Si and 0.1% A by weight to 2.3% by weight of Mg, and the Al—Si—Mg alloy film contains Mg silicide crystals in Al crystals. A semiconductor device includes a gate trench structure, an interlayer insulating film covering the trench gate structure, an electrode film covering the interlayer insulating film, an insulating layer and a conductive layer covering the electrode film. The electrode film includes the Al—Si—Mg alloy film.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
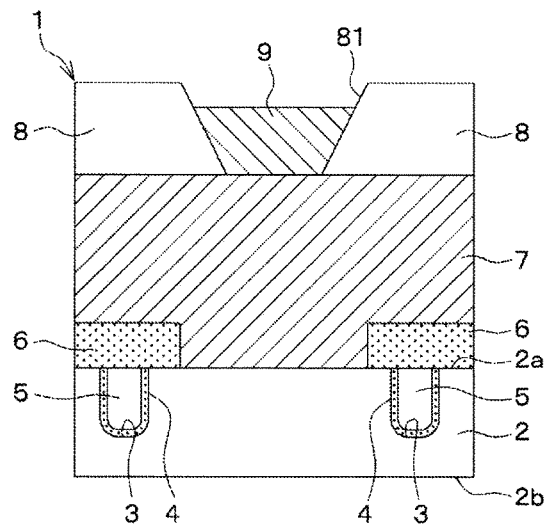
FIG. 1 is a cross-sectional view illustrating a semiconductor device of a first embodiment.

For example, in the field of in-vehicle use and the like, reduction in size of a semiconductor device has progressed. However, when the size of the semiconductor device is reduced, sizes of a semiconductor element and an electrode, which are components of the semiconductor device, are also reduced. Therefore, migration in the electrode may occur or a heat generation amount may increase due to the increase in resistance.

As a method for solving the above issues, an electrode may be made o an Al (aluminum) alloy film. The Al alloy film is mainly made of Al—Cu (copper), and has a structure in which at least one of the group X consisting of Nd (neodymium), Gd (gadolinium), La (lanthanum) and Mg (magnesium) is added. The Al alloy film can have high film hardness while having low resistance.

The present inventors investigated reduction in size of a configuration including a semiconductor element that includes an electrode film, an insulating layer partially covering the electrode film, and a conductive layer covering a portion of the electrode film exposed from the insulating layer. As a result, it was found that the thermal stress concentrates at a point of the electrode film in contact with the insulating layer and the conductive layer (hereinafter, referred to as "triple point" for convenience), and cracks occur.

When the present inventors made the electrode film with an alloy film of Al—Cu—X, cracks at the triple point of the electrode film were suppressed. However, on the other hand, a new issue has been found in which cracks occur in another layer covered with the electrode film. That is, in order to further improve the reliability of the semiconductor device having the above configuration, it is required to achieve both film hardness for suppressing cracks in the electrode film and relaxation of stress applied to another film covered by the electrode film.

According to a first aspect of the present disclosure, an aluminum alloy film to be used for an electrode in a power semiconductor element includes an Al—Si—Mg alloy film containing at least 0.9% by weight to 1.1% by weight of Si and 0.1% by weight to 2.3% by weight of Mg, and the Al—Si—Mg alloy film contains Mg silicide crystals in Al crystals.

The above-described aluminum alloy film containing the Mg silicide crystals in the Al crystals can have a film hardness capable of suppressing cracks in the aluminum alloy film and relaxing stress applied to another film adjacent to the aluminum alloy film.

According to a second aspect of the present disclosure, a semiconductor device includes a vertical semiconductor element including a substrate, gate trenches, a gate insulating film, a gate electrode, an interlayer insulating film, an electrode film, an insulating layer, and a conductive layer. The substrate has a first surface and a second surface opposite to each other and is made of silicon or silicon carbide. The gate trenches extend from the first surface toward the second surface and are arranged away from each other. The gate insulating film covers an inner wall of each of the gate trenches. The gate electrode is disposed on the gate insulating film and fills each of the gate trenches. The interlayer insulating film is disposed on the first surface, covers the gate trenches, and has a contact hole exposing a part of a region between adjacent gate trenches in the gate trenches in the first surface. The electrode film is disposed on the interlayer insulating film. The insulating layer is disposed on the electrode film and has an opening portion exposing a part of the electrode film. The conductive layer is disposed on the opening portion and covers the part of the electrode film exposed from the insulating layer. The electrode film includes an aluminum alloy layer made of an Al—Si—Mg alloy containing at least 0.9% by weight to 1.1% by weight of Si and 0.1% by weight to 2.3% by weight of Mg, and the aluminum alloy layer contains Mg silicide crystals in Al crystals.

This semiconductor device has a trench gate structure in which the trench gate extending from the first surface toward the second surface of the substrate is covered with the interlayer insulating film, and includes the electrode film disposed on the interlayer insulating film, the insulating layer covering the part of the electrode film and having the opening portion, and the conductive layer covering the electrode film at the opening portion. At least a part of the electrode film has the aluminum alloy layer having a film hardness that is capable of suppressing cracks in the aluminum alloy layer and relaxing stress applied to another film adjacent to the aluminum alloy layer. Therefore, the semiconductor device can suppress cracks originating from a triple point in the electrode film in contact with the insulating layer and the conductive layer, and relax stress applied to the interlayer insulating film covered with electrode film, and thereby suppressing cracks in the interlayer insulating film.

Hereinbelow, embodiments of the present disclosure will be described with reference to the drawings. In the following embodiments, the same or equivalent parts are denoted by the same reference numerals.

First Embodiment

A semiconductor device 1 according to a first embodiment will be described with reference to FIG. 1.
[Basic Configuration]

The semiconductor device 1 of the present embodiment includes, for example, a vertical semiconductor element having a trench gate structure. The present disclosure describes, as a typical example, a case where a vertical power semiconductor device with a MOSFET is formed, but the present disclosure is not limited to this device structure.

As shown in FIG. 1, for example, the semiconductor device 1 includes a substrate 2, a trench gate structure composed of a gate trench 3, a gate insulating film 4, and a gate electrode 5 formed to the substrate 2, an interlayer insulating film 6, an electrode film 7, an insulating layer 8, and a conductive layer 9.

The substrate 2 is, for example, a semiconductor substrate made of Si (silicon) or SiC (silicon carbide). The substrate 2 has a plate shape having a first surface $2a$ and a second surface $2b$ opposite to each other in a thickness direction. For example, in a region where the MOSFET is formed, an $n^+$-type layer, an $n^-$-type layer, an n-type layer, a p-type layer, and an $n^+$-type layer made of SiC are laminated from the second surface $2b$ to the first surface $2a$. The substrate 2 is obtained, for example, by laminating each of the above-described layers on an $n^+$-type substrate having the second surface $2b$ by epitaxial growth.

The $n^+$-type layer on the second surface $2b$ of the substrate 2 has, for example, an n-type impurity concentration of $1.0 \times 10^{19}$ cm$^3$, and has a surface on a (0001) Si plane. The $n^-$-type layer laminated on the $n^+$-type layer has, for example, an n-type impurity concentration of $0.5 \times_{10} 16$ cm$^3$ to $2.0 \times 10^{16}$/cm$^3$. The n-type layer laminated on the $n^-$-type layer has, for example, an n-type impurity concentration of about $8 \times 10^{16}$/cm$^3$, and has a higher concentration (that is, lower resistance) than the $n^-$-type layer. The n-type layer allows current to distribute and flow to a wider area and plays a role in reducing JFET resistance. The n-type layer has, for example, a thickness of 0.5 μm, and constitutes a drift layer together with the $n^-$-type layer.

The p-type layer laminated on the n-type layer in the substrate 2 is, for example, a portion where a channel region is formed. The p-type layer has a p-type impurity concentration of, for example, about $2.0 \times 10^{17}$/cm$^3$, and has a thickness of 300 nm. The $n^+$-type layer on the first surface $2a$ of the substrate 2 has a higher impurity concentration than the $n^-$-type layer. An n-type impurity concentration of a surface layer portion of the $n^+$-type layer is, for example, $2.5 \times 10^{18}$/cm$^3$ to $1.0 \times 10^{19}$/cm$^3$. The $n^+$-type layer has a thickness of 0.5 μm. The substrate 2 is formed with, for example, an annular guard ring (not shown) that surrounds the region where the MOSFET is formed. The substrate 2 has the gate trench 3 that is a groove extending from the first surface $2a$ toward the second surface $2b$, and penetrating the $n^+$-type layer on the first surface $2a$ and the p-type layer to reach the $n^-$-type layer.

Multiple gate trenches 3 are provided on the first surface $2a$ of the substrate 2, for example, and are arranged away from each other. The gate trenches 3 are arranged at a pitch of, for example, 1.0 μm, and have an aspect ratio of 2 or more. The aspect ratio is a ratio of a depth to a width. The gate trenches 3 are formed, for example, by anisotropic etching such as RIE (Reactive Ion Etching) using a mask. When viewed from the normal direction with respect to the first surface $2a$, the gate trenches 3 are formed in stripes in which linear grooves are arranged in parallel to each other at equal intervals. The gate insulating film 4 is formed on an inner wall surface of each of the gate trenches 3.

The gate insulating film 4 is provided along the inner wall surface of each of the gate trenches 3 and covers the inner wall surface. The gate insulating film 4 is made of, for example, SiO$_2$. The gate insulating film 4 is formed by CVD (chemical Vapor Deposition) with a thickness of about 100 nm, for example, using TEOS (tetraethoxysilane) as a gas material. A surface of the gate insulating film 4 is covered with the gate electrode 5 that fills each of the gate trenches 3.

The gate electrode 5 is made of, for example, doped Poly-Si containing P (phosphorus) as an n-type impurity at a concentration of about $1.0 \times 10^{17}$/cm$^3$ to $1.0 \times 10^{20}$/cm$^3$. The gate electrode 5 is formed, for example, by forming a doped Poly-Si film by CVD and then etching back so as to leave Poly-Si at least in each of the gate trenches 3.

As described above, multiple trench gate structures including the gate trench 3, the gate insulating film 4, and the gate electrode 5 are provided on the first surface $2a$ of the substrate 2 at a predetermined pitch. The interlayer insulating film 6 is formed on the first surface $2a$ of the substrate 2 to cover the trench gate structures.

The interlayer insulating film 6 is an insulating film that has a predetermined pattern shape, for example, covering the trench gate structures on the first surface $2a$ of the substrate 2 and having a contact hole for exposing a region between adjacent trench gate structures. The interlayer insulating film 6 is formed by CVD to a thickness of 300 nm to 900 nm, and is made of an insulating material such as BPSG (Boron Phosphorus Silicon Glass). The interlayer insulating film 6 electrically insulates the gate electrode 5 and the electrode film 7, and is covered with the electrode film 7.

In the present embodiment, the electrode film 7 is entirely made of an Al—Si—Mg alloy layer containing at least 0.9% by weight to 1.1% by weight of Si and 0.1% by weight to 2.3% by weight of Mg. Since the electrode film 7 is made of the Al—Si—Mg alloy layer having the above composition, the electrode film 7 has a film hardness that can suppress the generation of cracks starting from a triple point in contact with both the insulating layer 8 and the conductive layer 9, and can relax a stress applied to the interlayer insulating film 6. Further, the electrode film 7 is the aluminum alloy layer having the above composition, and has a structure in which Mg silicide crystals are present in Al crystals. Details will be described later. The electrode film 7 is formed so as to fill the contact hole while covering the interlayer insulating film 6, and is in ohmic contact with the first surface 2a of the substrate 2. The electrode film 7 is formed, for example, by preparing a target material made of an Al—Si—Mg alloy having the above composition and forming a film by a sputtering apparatus. In the case of sputtering, the electrode film 7 can be formed, for example, under the conditions of a DC power of 6.0 kW to 12.0 kW, a vacuum degree of 0.2 Pa, and a film forming temperature of 200° C. to 350° C., but film forming conditions are not limited to these conditions. The electrode film 7 is partially covered with the insulating layer 8, and a portion of the electrode film 7 exposed from an opening portion 81 of the insulating layer 8 is covered with the conductive layer 9.

The insulating layer 8 is made of any insulating resin material such as polyimide, and has a predetermined pattern shape having the opening portion 81. The insulating layer 8 is formed by forming a film by a wet film forming method such as a spin coating method and then patterning the film by a photography etching method or the like. The insulating layer 8 has thickness of, for example, 10.0 μm, which is larger than a thickness of the conductive layer 9.

The conductive layer 9 is made of, for example, a conductive metal material such as Ni (nickel) or an alloy thereof, and is electrically connected to the portion of the electrode film 7 exposed through the opening portion 81. The conductive layer 9 functions together with the electrode film 7 as a source electrode in the region where the MOSFET is formed, for example. The conductive layer 9 is a cover layer that covers the electrode film 7, and has a thickness of, for example, about 4.5 μm.

The electrode film 7 is a first electrode. On the second surface 2b of the substrate, a second electrode paired with the first electrode is formed. When the electrode film 7 is the source electrode, the second electrode is a drain electrode.

The above is the basic configuration of the semiconductor device of the present embodiment.

[Electrode Film]

Next, the composition of the electrode film 7 and effect of the electrode film 7 will be described in comparison with a semiconductor device of a comparative examples in which a film corresponding to the electrode film 7 is made of a conventional aluminum alloy film.

Hereinafter, for convenience of explanation, an aluminum alloy film having a structure in which α % by weight of element X1 is added to Al is referred to as "Al-α wt % X1", and an aluminum alloy film having a structure in which β % by weight of element X2 is added to Al-α wt % X1 is referred to as "Al-α wt % X-β wt % X2". Further, aluminum alloy films in which 0.9% by weight to 1.1% by weight of Si and 0.1 to 2.3% by weight of Mg are added to Al are collectively referred to as "Al—Si—Mg alloy films".

Figure 2:
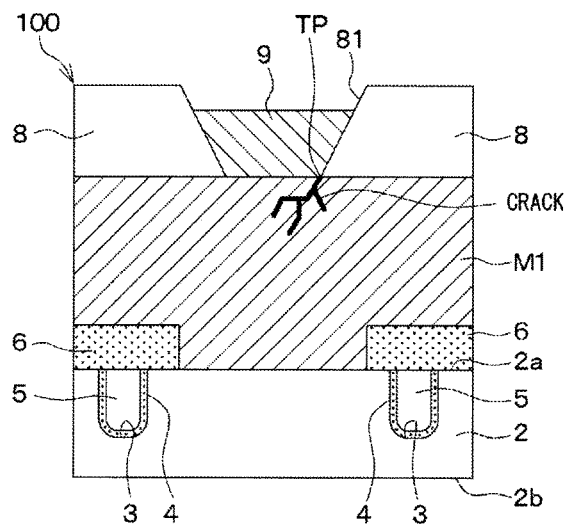
FIG. 2 is a diagram showing cracks in an electrode film in a semiconductor device of a comparative example.

As shown in FIG. 2, for example, a semiconductor device 100 of a comparative example has a basic configuration similar to the semiconductor device 1 of the present embodiment, but a film corresponding to the electrode film 7 is an electrode film M1 made of Al-1 wt % Si. The electrode film M1 is an aluminum alloy film having a lower hardness than the Al—Si—Mg alloy film and having a composition that makes it easier to relax a stress applied to the interlayer insulating film 6.

However, when the present inventors conducted a reliability evaluation test on the semiconductor device 100 of the comparative example by a thermal cycle, it was found that cracks originating from a triple point TP, which is a portion of the electrode film M1 in contact with both the insulating layer 8 and the conductive layer 9, occurs. It is considered that this is because the stress concentrates on the triple point TP and the film hardness of the electrode film M1 cannot withstand the stress.

Figure 3:
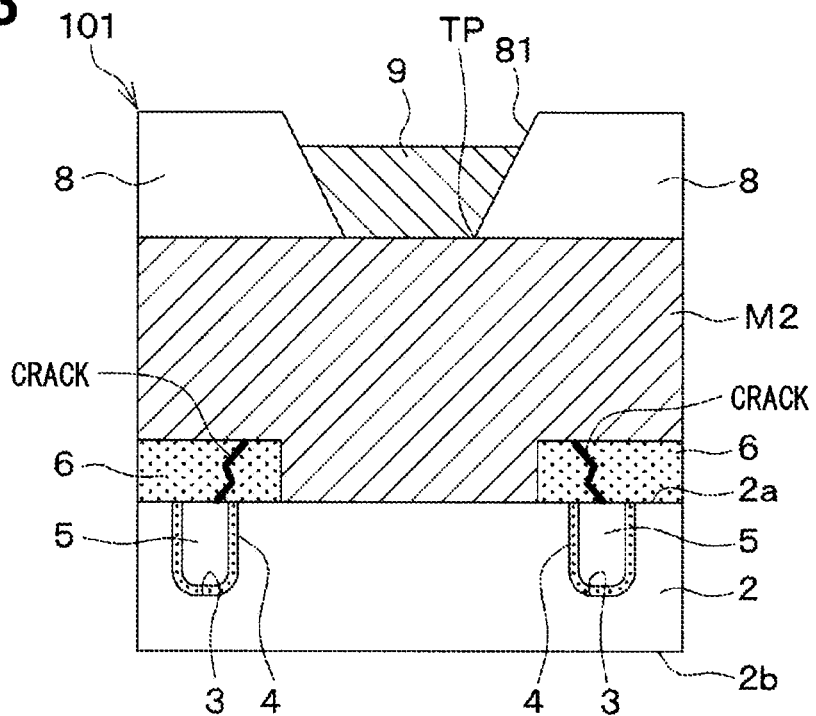
FIG. 3 is a diagram showing cracks in an interlayer insulating film in a semiconductor device of another comparative example.

Therefore, as shown in FIG. 3, for example, the present inventors made a semiconductor device 101 of another comparative example provided with an electrode film M2 made of an aluminum alloy film having a film hardness higher than the film hardness of the electrode film M1 and conducted the same reliability evaluation test. The electrode film M2 is made of, for example, Al-1 wt % Cu. As a result of the reliability evaluation test, in the semiconductor device 101 of the comparative example, cracks did not occur in the electrode film M2, but cracks occurred in the interlayer insulating film 6 covered with the electrode film M2. It is considered that this is because the film hardness of the electrode film M2 is large and cracks in the electrode film M2 can be suppressed, but the effect of relaxing stress is weakened due to the film being too hard, and the stress concentrates on the interlayer insulating film 6.

The above results indicate that it is necessary to adjust the film hardness to be compatible with crack suppression in the electrode film and stress relaxation applied to the interlayer insulating film 6.

Figure 4:
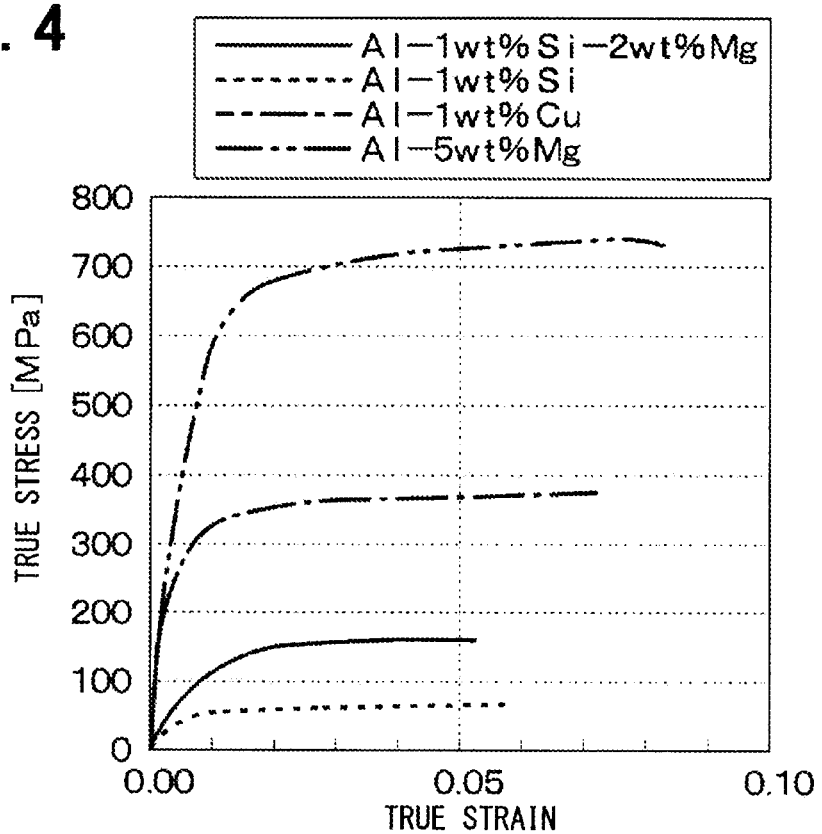
FIG. 4 is a graph showing strain-tensile properties of aluminum alloys having different compositions.

Here, FIG. 4 shows the results of evaluating the strain-tensile properties of multiple aluminum alloy films having different compositions. In FIG. 4, the horizontal axis is true strain and the vertical axis is true stress.

In Al-1 wt % Si, the true stress increased to about 50 MPa with increase in the true strain from 0 to 0.01, and the true stress was about 60 MPa when the true strain exceeded 0.01. It is considered that since the electrode film M1 made of Al-1 wt % Si is a soft and brittle aluminum alloy, cracks occurred in the electrode film M1.

In Al-1 wt % Cu, the true stress increased to about 320 MPa with increase in the true strain from 0 to 0.01, and the true stress was about 380 MPa when the true strain exceeded 0.01. It is considered that since the electrode film M2 made of Al-1 wt % Cu is an aluminum alloy having a harder property than Al-1 wt % Si, no crack occurs in the electrode film M2, but the stress relaxation effect is weakened.

In Al-5 wt % Mg, the true stress increased to about 630 MPa with increase in the true strain from 0 to 0.01, and the true stress gradually increased even when the true strain exceeded 0.01, and the true stress was about 720 MPa until the true strain reached 0.05. It is considered that since Al-5 wt % Mg is an aluminum alloy film having a harder property than Al-1 wt % Cu, when an electrode film is made of Al-5 wt % Mg, a result similar to Al-1 wt % Cu is obtained.

Therefore, in order to achieve both suppression of cracks in the electrode film and relaxation of stress applied to the interlayer insulating film 6, for example, an aluminum alloy film may be formed to have a strain-tensile property between Al-1 wt % Si and Al-1 wt % Cu.

As a result of diligent studies, the present inventors have found that the above compatibility is possible by using Al—Si—Mg alloy films. For example, in Al-1 wt % Si-2 wt % Mg, the true stress increased to about 150 MPa with increase in the true strain from 0 to 0.02, and the true strain was almost constant after that. When a reliability evaluation test similar to that of the semiconductor device 100 of the comparative example was conducted on the semiconductor device 1 provided with the electrode film 7 made of the Al—Si—Mg alloy film having the above property, no cracks occurred in any of the electrode film 7 and the interlayer insulating film 6.

Subsequently, the relationship between the Mg content and the film harnesses of Al—Si—Mg alloy films will be described with reference to FIG. 5.

Figure 5:
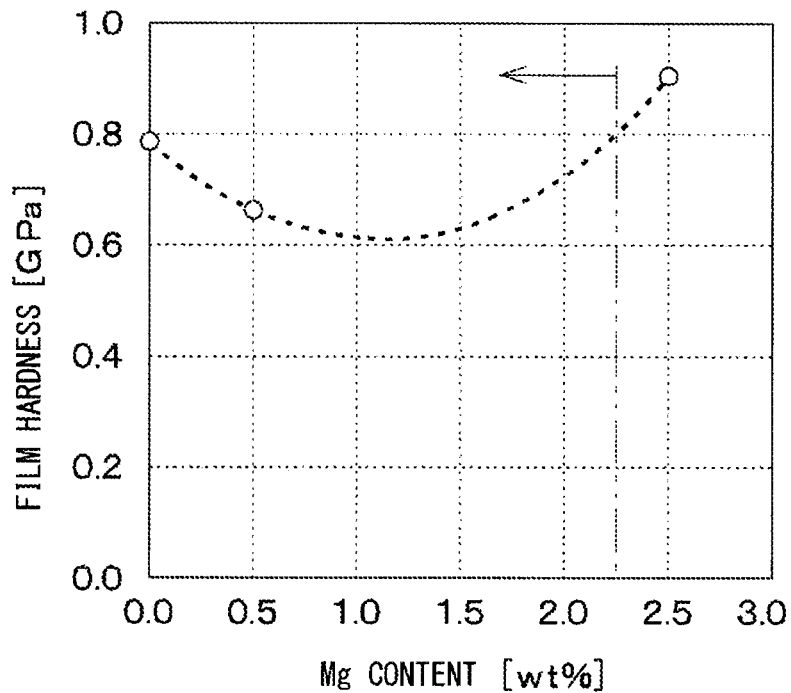
FIG. 5 is a diagram showing a relationship between a Mg content and a film hardness in an Al—Si alloy.

The results shown in FIG. 5 were obtained by preparing evaluation samples in which an Al—Si alloy film or an Al—Si—Mg alloy film having a different Mg content was formed on a silicon substrate at 5.0 µm and performing a nanoindentation measurement. The aluminum alloy films of the evaluation samples were formed by sputtering using target materials that are based on Al—Si in which 0.9% by weight to 1.1% by weight of Si is added to Al, and have different Mg contents.

The Al—Si alloy film containing no Mg had a film hardness of about 0.78 GPa. The Al—Si—Mg alloy films had a film hardness of about 0.66 GPa when the Mg content is 0.5% by weight, and had a film hardness of about 0.90 GPa when the Mg content is 2.5% by weight although it is an estimated value. The curve shown by the broken line in FIG. 5 is obtained by approximating these results by a least squares method. As a result of the study by the present inventors, the film hardness required to suppress cracks in the aluminum alloy film was 0.6 GPa to 0.8 GPa. The Mg content satisfying this condition is 2.3% by weight or less.

Next, the relationship between the Mg content in the Al—Si—Mg alloy film and the strain amount in the interlayer insulating film 6 will be described with reference to FIG. 6.

Figure 6:
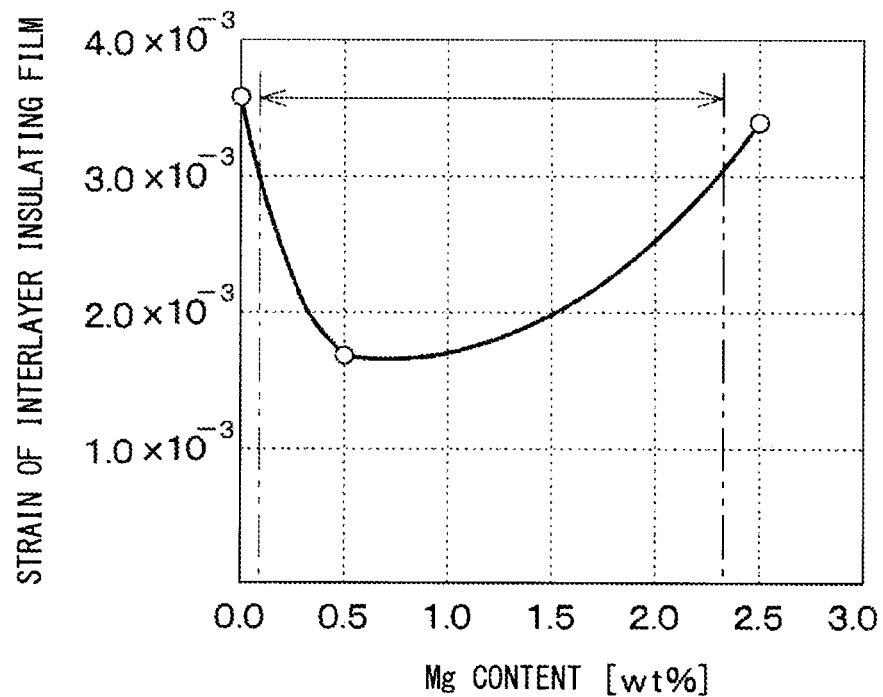
FIG. 6 is a diagram showing a relationship between a Mg content in an Al—Si alloy and a strain amount of an interlayer insulating film.

The results shown in FIG. 6 are obtained by simulation calculation using CAE analysis. The CAE analysis uses simulation models in which a BPSG film (corresponding to the interlayer insulating film 6) having a thickness of 900 nm is formed on a silicon substrate, and an Al—Si film or an Al—Si—Mg alloy film with different Mg content having a thickness of 0.5 µm is formed on the BPSG film. "Strain of interlayer insulating film" on the vertical axis of FIG. 6 is a simulation result of a BPSG film of analysis models described later.

The strain mount of the BPSG film covered with the Al—Si alloy film containing no Mg is about $3.5 \times 10^{-3}$. When the Mg content of the Al—Si—Mg alloy film is 0.5% by weight, the strain amount of the BPSG film is about $1.7 \times 10^{-3}$. When the Mg content of the Al—Si—Mg alloy film is 2.5% by weight, the strain amount of the BPSG film is $3.4 \times 10^{-3}$. The curve shown in FIG. 6 is obtained by approximating these results by a least squares method. As a result of the study by the present inventors, it was found that cracks of the BPSG film can be suppressed when the strain amount is $3.0 \times 10^{-3}$ or less. The Mg content satisfying this condition is 0.1% by weight to 2.3% by weight.

These results show that it is necessary to set the Mg content in a range from 0.1% by weight to 2.3% by weight in order to obtain an Al—Si—Mg alloy film that can suppress cracks in the electrode film 7 and relax stress applied to the interlayer insulating film 6. That is, when the electrode film 7 is made of an Al—Si—Mg alloy film containing 0.9% by weight to 1.1% by weight of Si and 0.1% by weight to 2.3% by weight of Mg, the electrode film 7 can suppress cracks in the electrode film 7 and relax stress applied to another film.

Figure 7:
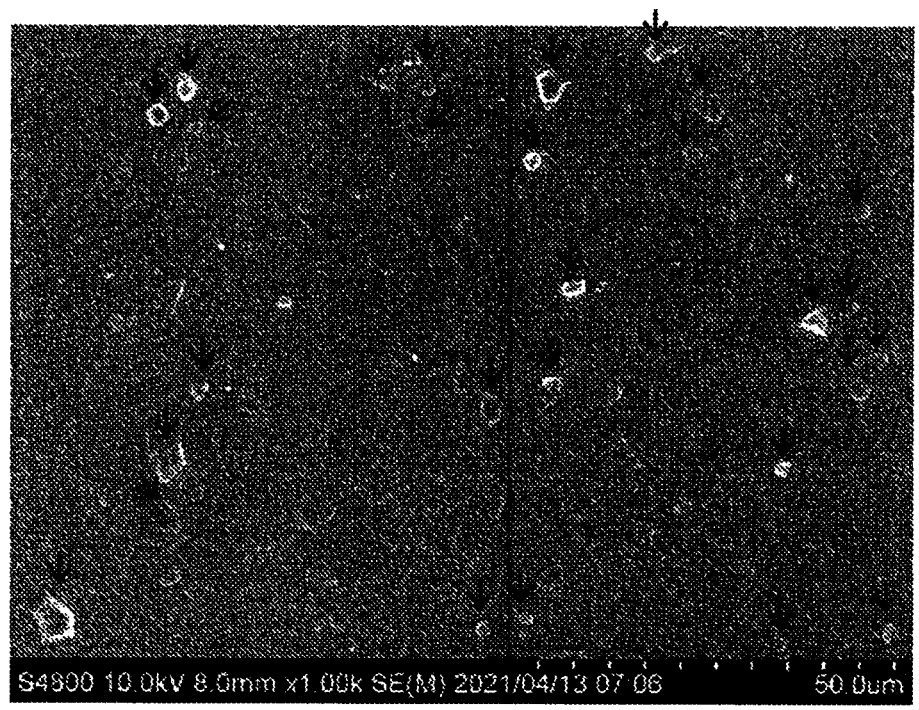
FIG. 7 is a SEM (Scanning Electron Microscope) observation result of an Al—Si—Mg alloy film and is a diagram showing the presence of Mg silicide crystals in Al crystals.

When a surface of a sample in which an Al—Si—Mg alloy film was formed on a silicon substrate was observed by SEM, for example, as shown in FIG. 7, Mg silicide crystals were present in Al crystals. The Al—Si—Mg alloy film in the sample shown in FIG. 7 is Al-1.0 wt % Si—0.5 wt % Mg. In FIG. 7, arrows indicate the Mg silicide crystals.

In the present embodiment, the Al—Si—Mg alloy film can suppress cracks in the Al—Si—Mg alloy film and relax the stress applied to another films covered by the Al—Si—Mg alloy film when the Al—Si—Mg alloy film contains at least 0.9% by weight to 1.1% by weight of Si and 0.1% by weight to 2.3% by weight of Mg. Further, when the semiconductor device 1 has a structure in which the electrode film 7 is formed by the Al—Si—Mg alloy film and the interlayer insulating film 6 is covered with the electrode film 7, the semiconductor device 1 can have a power semiconductor element with high reliability in which cracks in the electrode film 7 and the interlayer insulating film 6 are suppressed.

Second Embodiment

A semiconductor device 1 according to a second embodiment will be described with reference to FIG. 8.

Figure 8:
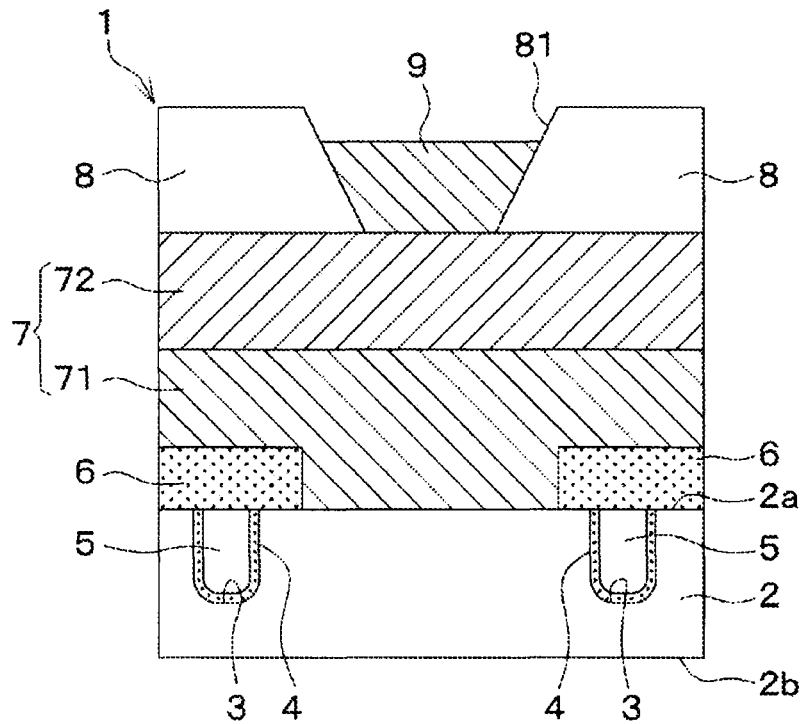
FIG. 8 is a cross-sectional view illustrating a semiconductor device of a second embodiment.

As shown in FIG. 8, for example, the semiconductor device 1 of the present embodiment is different from the semiconductor device 1 of the first embodiment in that the electrode film 7 has a laminated structure in which a first layer 71 and a second layer 72 are laminated on the interlayer insulating film 6 in the stated order. The following describes the difference between the present embodiment and the first embodiment.

In the present embodiment, the electrode film 7 is formed by laminating two aluminum alloy films having different compositions, and the total thickness is, for example, about 5.0 µm.

The first layer 71 is made of an Al—Si—Mg alloy film containing at least 0.9% by weight to 1.1% by weight of Si and 0.1% by weight to 2.3% by weight of Mg. The first layer 71 has a thickness of, for example, 1.0 µm to 2.5 µm, and has such a film hardness that the first layer 71 can suppress cracks in the first layer 71 and relax a stress applied to the interlayer insulating film 6 from the insulating layer 8, the conductive layer 9 and the second layer 72.

The second layer 72 has a composition different from the composition of the first layer 71, and is made of an aluminum alloy film having at least a film hardness higher than the film hardness of the first layer 71. The second layer 72 is made of an any aluminum alloy film such as an Al-1 wt % Si alloy, an Al-1 wt % Cu alloy, an Al-5 wt % Mg alloy, or an alloy containing other metal elements added thereto. The second layer 72 may have a film hardness at least capable of suppressing cracks starting from a triple point in contact with the insulating layer 8 and the conductive layer 9, and may be made of an aluminum alloy film having another known composition. The thickness of the second layer 72 is, for example, 2.5 µm to 4.0 µm when the thickness of the electrode film 7 is 5.0 µm.

The semiconductor device 1 according to the second embodiment provides advantageous effects similar to those of the first embodiment.

Third Embodiment

A semiconductor device 1 according to a third embodiment will be described with reference to FIG. 9.

Figure 9:
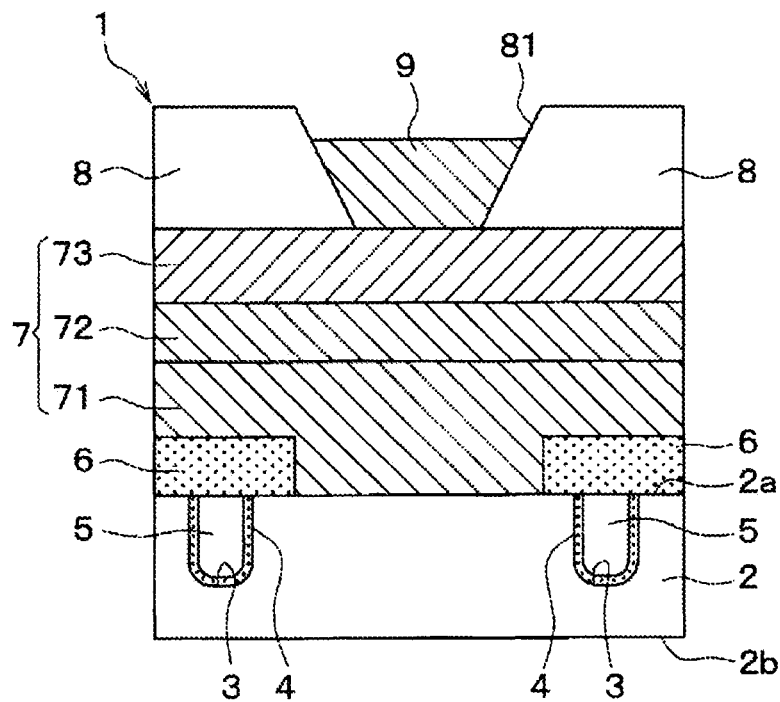
FIG. 9 is a cross-sectional view illustrating a semiconductor device of a third embodiment.

As shown in FIG. 9, for example, the semiconductor device 1 of the present embodiment is different from the semiconductor device 1 of the first embodiment in that the electrode film 7 has a laminated structure in which a first layer 71 and a second layer 72, and a third layer 73 are laminated on the interlayer insulating film 6 in the stated order. The following describes the difference between the present embodiment and the first embodiment.

In the present embodiment, the electrode film 7 is formed by laminating three aluminum alloy films, and the total thickness is, for example, about 5.0 μm.

Each of the first layer 71 and the third layer 73 has a composition different from a composition of the second layer 72, and is made of an aluminum alloy film having a film hardness higher than a film hardness of the second layer 72. The first layer 71 and the third layer 73 have any compositions such as an Al-1 wt % Si alloy, an Al-1 wt % Cu alloy, an Al-5 wt % Mg alloy, or those to which other metal elements are added. However, the first layer 71 and the third layer 73 may be aluminum alloy films having other known composition. The thickness of each of the first layer 71 and the third layer 73 is, for example, about 2.0 μm when the thickness of the electrode film 7 is 5.0 μm. The first layer 71 and the third layer 73 may be aluminum alloy films having the same composition or aluminum alloy films having different compositions.

The first layer 71 has the film hardness higher than the film hardness of an Al—Si—Mg alloy film and a stress relaxation effect of the first layer 71 is smaller than the stress relaxation effect of the Al—Si—Mg alloy film. However, when the first layer 71 has a film thickness equal to less than a predetermined thickness such as 2.0 μm, the stress applied to the interlayer insulating film 6 is relaxed.

Since the film hardness of the third layer 73 is higher than the film hardness of the Al—Si—Mg alloy film, the third layer 73 can suppress cracks originating from the triple point in contact with both the insulating layer 8 and the conductive layer 9. The semiconductor device 1 of the present embodiment has a configuration in which the stress applied to the interlayer insulating film 6 due to the film hardness of the third layer 73 is relaxed by the second layer 72 having a predetermined film hardness.

The first layer 71 is made of an Al—Si—Mg alloy film containing at least 0.9% by weight to 1.1% by weight of Si and 0.1% by weight to 2.3% by weight of Mg. The second layer 72 has, for example, a thickness of about 1.0 μm, and has such a film hardness that the second layer 72 can suppress cracks in the second layer 72 and relax a stress applied to the interlayer insulating film 6 from the insulating layer 8, the conductive layer 9 and the third layer 73.

The semiconductor device 1 according to the third embodiment provides advantageous effects similar to those of the first embodiment.

Other Embodiments

Although the present disclosure has been described in accordance with the above-described embodiments, it is understood that the present disclosure is not limited to the above-described embodiments and structures. The present disclosure encompasses various modifications and variations within the scope of equivalents. In addition, as the various combinations and configurations, which are preferred, other combinations and configurations, including more, less or only a single element, are also within the spirit and scope of the present disclosure.

For example, the semiconductor device 1 of the second embodiment may have a configuration in which the first layer 71 and the second layer 72 are reversed. In this case, the electrode film 7 includes the first layer 71 made of an aluminum alloy film having a film hardness higher than that of the Al—Si—Mg alloy film, and the second layer 72 made of an Al—Si—Mg alloy film. That is, the second layer 72 functions as a stress relaxation layer that relaxes a stress applied to the interlayer insulating film 6 from the insulating layer 8. Even in this case, the semiconductor device 1 can obtain effects similar to the effects of the first embodiment.

What is claimed is:

1. An aluminum alloy film to be used for an electrode in a power semiconductor element, comprising:
   an Al—Si—Mg alloy film containing Al, Si, and Mg, wherein
   a content of Si in the Al—Si—Mg alloy film is within a range from 0.9% by weight to 1.1% by weight,
   a content of Mg in the Al—Si—Mg alloy film is within a range from 0.1% by weight to 2.3% by weight, and
   the Al—Si—Mg alloy film contains Mg silicide crystals in Al crystals.

2. A semiconductor device comprising a vertical semiconductor element having a trench gate structure, the vertical semiconductor element including:
   a substrate having a first surface and a second surface opposite to each other and made of silicon or silicon carbide;
   a plurality of gate trenches extending from the first surface toward the second surface and arranged away from each other;
   a gate insulating film covering an inner wall of each of the plurality of gate trenches;
   a gate electrode disposed on the gate insulating film and filling each of the plurality of gate trenches;
   an interlayer insulating film disposed on the first surface, covering the plurality of gate trenches, and having a contact hole exposing a part of a region between adjacent gate trenches in the plurality of gate trenches in the first surface;
   an electrode film disposed on the interlayer insulating film;
   an insulating layer disposed on the electrode film and having an opening portion exposing a part of the electrode film; and
   a conductive layer disposed on the opening portion and covering the part of the electrode film exposed from the insulating layer, wherein
   the electrode film includes an aluminum alloy layer made of an Al—Si—Mg alloy containing at least 0.9% by weight to 1.1% by weight of Si and 0.1% by weight to 2.3% by weight of Mg, and
   the aluminum alloy layer contains Mg silicide crystals in Al crystals.

3. The semiconductor device according to claim 2, wherein
   the electrode film is entirely made of the aluminum alloy layer.

4. The semiconductor device according to claim 2, wherein
   the electrode film includes a first layer and a second layer laminated on the interlayer insulating film in a stated order,
   the first layer is made of the aluminum alloy layer, and
   the second layer is made of an aluminum alloy having a film hardness higher than a film hardness of the first layer.

5. The semiconductor device according to claim 2, wherein
- the electrode film includes a first layer, a second layer, and a third layer laminated on the interlayer insulating film in a stated order,
- the second layer is made of the aluminum alloy layer, and
- each of the first layer and the third layer is made of an aluminum alloy having a film hardness higher than a film hardness of the second layer.

6. The semiconductor device according to claim 2, wherein
- the electrode film includes a first layer and a second layer laminated on the interlayer insulating film in a stated order,
- the second layer is made of the aluminum alloy layer, and
- the first layer is made of an aluminum alloy having a film hardness higher than a film hardness of the second layer.

* * * * *